United States Patent
Lee et al.

(10) Patent No.: US 9,508,943 B2
(45) Date of Patent: Nov. 29, 2016

(54) ORGANIC LIGHT EMITTING DIODE DISPLAY DEVICE

(71) Applicant: LG DISPLAY CO., LTD., Seoul (KR)

(72) Inventors: Jae-Young Lee, Daejeon (KR); Hee-Chul Lim, Paju-si (KR); Hyun-Tae Byun, Incheon (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 13/932,865

(22) Filed: Jul. 1, 2013

(65) Prior Publication Data
US 2014/0166995 A1 Jun. 19, 2014

(30) Foreign Application Priority Data
Dec. 17, 2012 (KR) .................. 10-2012-0147213

(51) Int. Cl.
*H01L 29/08* (2006.01)
*H01L 51/00* (2006.01)
*H01L 51/52* (2006.01)

(52) U.S. Cl.
CPC ....... *H01L 51/0097* (2013.01); *H01L 51/5259* (2013.01); *Y02E 10/549* (2013.01)

(58) Field of Classification Search
CPC .......... H01L 51/0545; H01L 51/0036; H01L 27/1214; H01L 27/12; H01L 29/66757; H01L 29/78621; B82Y 10/00; G02F 1/136227; G02F 1/13454
USPC ............... 257/40, 59, 72; 313/506
See application file for complete search history.

(56) References Cited

U.S. PATENT DOCUMENTS

| | | | |
|---|---|---|---|
| 2003/0117066 A1 | 6/2003 | Silvernail | |
| 2004/0195960 A1* | 10/2004 | Czeremuszkin | C08J 7/045 313/504 |
| 2010/0148661 A1* | 6/2010 | Farquhar | H01L 51/5246 313/504 |
| 2011/0025196 A1* | 2/2011 | Rakuff | H01L 51/5246 313/504 |
| 2011/0049491 A1* | 3/2011 | De Vries | H05H 1/48 257/40 |
| 2011/0240966 A1* | 10/2011 | Lees et al. | 257/40 |
| 2011/0281092 A1* | 11/2011 | Ryu | B32B 7/02 428/212 |
| 2012/0146922 A1* | 6/2012 | Kang | G06F 3/044 345/173 |

FOREIGN PATENT DOCUMENTS

| | | |
|---|---|---|
| CN | 1543514 A | 11/2004 |
| CN | 1874624 A | 12/2006 |
| WO | WO 03/016589 A1 | 2/2003 |

* cited by examiner

*Primary Examiner* — Cuong Q Nguyen
*Assistant Examiner* — Nishath Yasmeen
(74) *Attorney, Agent, or Firm* — Birch, Stewart, Kolasch & Birch, LLP

(57) ABSTRACT

An organic light emitting diode display device is disclosed. The organic light emitting diode display device includes an organic light emitting diode array formed on a flexible substrate, a cover film formed to cover the organic light emitting diode array, and a bottom film attached to a lower surface of the flexible substrate. Reliability of the organic light emitting diode display device may be improved by forming a cover film attached to the organic light emitting diode array and a bottom film attached to the lower surface of the flexible substrate on which the organic light emitting diode array is formed using the same material, and forming a moisture absorbent on the bottom film.

9 Claims, 3 Drawing Sheets

ORGANIC LIGHT EMITTING DIODE DISPLAY DEVICE

This application claims the benefit of Korean Patent Application No. 10-2012-0147213, filed on Dec. 17, 2012, which is hereby incorporated by reference as if fully set forth herein.

BACKGROUND OF THE INVENTION

Field of the Invention

The present invention relates to an organic light emitting diode display device, and more particularly, to an organic light emitting diode display device capable of improving reliability.

Discussion of the Related Art

Image display devices for displaying various image information have become increasingly slim, lightweight, and portable in keeping with consumer demand in the information age. An organic light emitting diode display device that displays an image by controlling the amount of light of an organic emission layer is spotlighted as a flat panel display device capable of reducing weight and volume of a cathode ray tube (CRT).

An organic light emitting diode display device includes a thin film transistor and an organic light emitting diode connected to the thin film transistor formed in each sub pixel region of a substrate. Since the organic light emitting diode is vulnerable to moisture and oxygen, an encapsulation substrate is formed to cover the organic light emitting diode.

The organic light emitting diode includes a first electrode constituting an anode, an emission layer (EML) and a second electrode constituting a cathode which are sequentially formed. When a voltage is applied between the first and second electrodes, holes and electrons are recombined in the EML to generate excitons. Light emission occurs via transition of excitons from an excited state to the ground state.

In particular, a flexible organic light emitting diode display device may be implemented by forming an organic light emitting diode on a flexible substrate and forming an encapsulation substrate using a flexible cover film. In this case, however, the cover film has a different coefficient of thermal expansion from a bottom film attached to the lower surface of the flexible substrate in order to prevent moisture or oxygen from infiltrating through the flexible substrate. Accordingly, the organic light emitting diode display device may warp, thereby deteriorating reliability.

Furthermore, the bottom film and an optically clear adhesive (OCA) generally used to attach the bottom film to the flexible substrate have poor resistance to humidity. Thus, reliability of the organic light emitting diode display device against moisture is deteriorated.

SUMMARY OF THE INVENTION

Accordingly, the present invention is directed to an organic light emitting diode display device that substantially obviates one or more problems due to limitations and disadvantages of the related art.

An object of the present invention is to provide an organic light emitting diode display device capable of improving reliability by forming a cover film attached to an upper surface of an organic light emitting diode array and a bottom film attached to a lower surface of the organic light emitting diode array using the same material and disposing a moisture absorbent on the bottom film.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic light emitting diode display device includes an organic light emitting diode array formed on a flexible substrate, a cover film formed to cover the organic light emitting diode array, and a bottom film attached to a lower surface of the flexible substrate. The cover film and the bottom film are formed of the same material, and a moisture absorbent is formed between the bottom film and the flexible substrate.

A plurality of moisture absorbents may be disposed on an upper surface of the bottom film.

The plurality of absorbents may have the same shape or different shapes.

The cover film may be adhered to the organic light emitting diode array and the bottom film may be adhered to the flexible substrate respectively via an adhesive layer formed of a material selected from the group consisting of an acrylic pressure sensitive adhesive, an olefin pressure sensitive adhesive, and a silicone pressure sensitive adhesive.

The organic light emitting diode display device may further includes a barrier layer formed on at least one of the upper and lower surfaces of the cover film and at least one of the upper and lower surfaces of the bottom film The barrier layer may have a single layer structure or a multilayer structure including an inorganic layer or organic layer alone or a multilayer structure in which an inorganic layer and an organic layer are laminated.

The inorganic layer may include a material including silicon (Si) or aluminum (Al) selected from the group consisting of aluminum oxide ($Al_xO_y$), silicon oxynitride ($SiON_x$), silicon oxide ($SiO_x$), and silicon nitride ($SiN_x$).

The organic layer may include an epoxy organic material or an acrylic organic material.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, an organic light emitting diode display device according to the present invention will be described in detail with reference to the accompanying drawings.

*First Embodiment*

Figure 1:
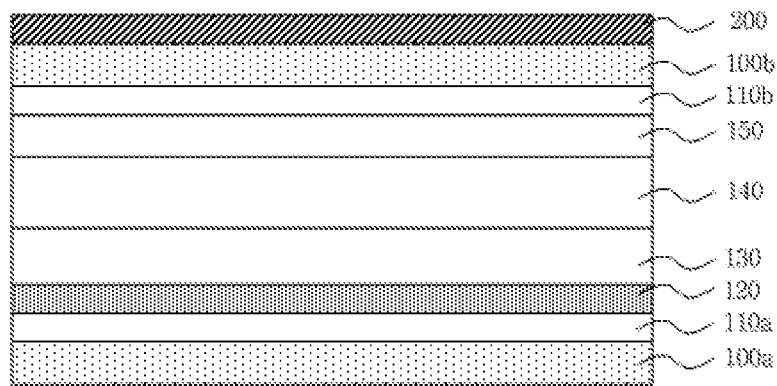
FIG. 1 is a cross-sectional view illustrating an organic light emitting diode display device according to a first embodiment of the present invention.
Figure 2:
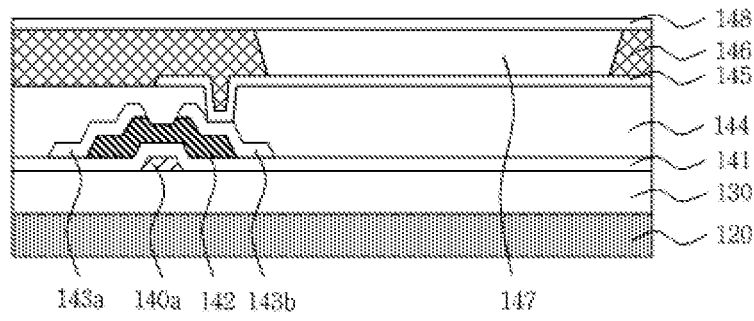
FIG. 2 is a cross-sectional view illustrating an organic light emitting diode array of FIG. 1.

FIG. 1 is a cross-sectional view illustrating an organic light emitting diode display device according to a first embodiment of the present invention. FIG. 2 is a cross-sectional view illustrating an organic light emitting diode array of FIG. 1.

Referring to FIG. 1, the organic light emitting diode display device according to the present invention includes an organic light emitting diode array 140 formed on a flexible substrate 120, a cover film 100b attached to cover the organic light emitting diode array 140, and a bottom film 100a attached to the lower surface of the flexible substrate 120.

Particularly, the flexible substrate 120 is a plastic film including at least one organic material selected from the group consisting of polyethylene naphthalate (PEN), polyethylene terephthalate (PET), polyethylene ether phthalate, poly carbonate, poly arylate, polyether imide, polyether sulfonate, polyimide, and polyacrylate.

A buffer layer 130 is disposed between the flexible substrate 120 and the organic light emitting diode array 140. The buffer layer 130 is formed to prevent moisture and oxygen passing through the flexible substrate 120 from diffusing into the organic light emitting diode array 140.

The buffer layer 130 may have a single layer structure or a multilayer structure including an inorganic insulating material such as silicon oxide ($SiO_x$) and silicon nitride ($SiN_x$). In addition, the buffer layer 130 may have a thickness of 2 μm or less.

The organic light emitting diode array 140 is formed on the flexible substrate 120 such that the buffer layer 130 is interposed therebetween. The organic light emitting diode array 140 includes a thin film transistor and an organic light emitting diode as illustrated in FIG. 2. The thin film transistor includes a gate electrode 140a, a gate insulating layer 141, a semiconductor layer 142, a source electrode 143a, and a drain electrode 143b. The organic light emitting diode includes a first electrode 145, an organic emission layer 147, and a second electrode 148.

Particularly, the gate electrode 140a is formed on the buffer layer 130, and the gate insulating layer 141 is formed to cover the gate electrode 140a. The semiconductor layer 142 is formed on the gate insulating layer 141 to overlap the gate electrode 140a. The source electrode 143a and the drain electrode 143b are formed on the semiconductor layer 142 to be spaced apart from each other.

An organic layer 144 is formed of an acrylic resin to cover the thin film transistor. The organic layer 144 is formed to planarize a lower flexible substrate 120a on which the thin film transistor is formed. Although not shown herein, an inorganic layer (not shown) formed of silicon oxide ($SiO_x$) or silicon nitride ($SiN_x$) is disposed between the gate insulating layer 141 and the organic layer 144 to improve stabilization of an interface between the organic layer 144 and each of the gate insulating layer 141, the source electrode 143a, and the drain electrode 143b.

In addition, the first electrode 145 connected to the drain electrode 143b and a bank insulating layer 146 partially exposing the first electrode 145 are formed on the organic layer 144. An organic emission layer 147 is formed on the exposed first electrode 145, and the second electrode 148 is formed to cover the organic emission layer 147. The bank insulating layer 146 defines a light emitting region of the organic light emitting diode array 140 and prevents leakage of light in a non-emitting region.

Referring back to FIG. 1, a protective layer 150 is formed to cover the organic light emitting diode array 140. The protective layer 150 may have a single layer structure or a multilayer structure including an inorganic insulating material. The inorganic insulating material contain silicon (Si) or aluminum (Al) such as aluminum oxide (AlOx), silicon oxynitride (SiON), silicon nitride ($SiN_x$), and silicon oxide ($SiO_x$). The protective layer 150 may also have a multilayer structure in which an organic insulating material and an inorganic insulating material are laminated. In this regard, the organic insulating material may be an epoxy organic insulating material or an organic insulating material containing a thermosetting material having a curing temperature of 100° C. or less.

In this regard, the inorganic insulating material is formed by low-temperature PECVD at 100° C. or less to protect the organic light emitting diode array 140.

The cover film 100b is adhered to the protective layer 150 via an upper adhesive layer 110b. The cover film 100b may have a thickness of 50 μm to 100 μm. The cover film 100b may be formed of an isotropic or anisotropic material such as a cyclic olefin copolymer (COC), cyclic olefin polymer (COP), polycarbonate (PC), polyethylene terephthalate (PET), and polyethylene naphthalate (PEN).

Particularly, when the cover film 100b has isotropic properties, the cover film 100b has a phase retardation of 0 nm to 3 nm. In addition, when the cover film 100b has anisotropic properties, the cover film 100b has a phase retardation of 120 nm to 148 nm.

The bottom film 100a is adhered to the lower surface of the flexible substrate 120 via a lower adhesive layer 110a. The bottom film 100a is formed to prevent moisture and oxygen passing through the flexible substrate 120 from diffusing into the organic light emitting diode array 140.

The bottom film 100a may also be formed of an isotropic or anisotropic material such as a cyclic olefin copolymer (COC), cyclic olefin polymer (COP), polycarbonate (PC), polyethylene terephthalate (PET), and polyethylene naphthalate (PEN).

When the bottom film 100a has isotropic properties, the bottom film 100a has a phase retardation of 0 nm to 3 nm. In addition, when the bottom film 100a has anisotropic properties, the bottom film 100a has a phase retardation of 120 nm to 148 nm. The bottom film 100a may have a thickness of 50 μm to 100 μm.

The upper adhesive layer 110b and the lower adhesive layer 110a are formed of an acrylic pressure sensitive adhesive, an olefin pressure sensitive adhesive, a silicone pressure sensitive adhesive. The upper adhesive layer 110b and the lower adhesive layer 110a have a thickness of 50 μm to 75 μm. Particularly, the upper adhesive layer 110b and the lower adhesive layer 110a respectively have a water vapor permeability of 10 g/m²·day or less and a transmittance of 95% or greater in the visible range. The upper adhesive layer 110b and the lower adhesive layer 110a respectively have an adhesion of 1300 gf/inch or greater on an alkali-free glass substrate. The upper adhesive layer 110b and the lower adhesive layer 110a respectively have a haze of 2% or less, as measured using a haze meter.

That is, in the organic light emitting diode display device according to the present invention, the cover film 100b and the bottom film 100a are formed of the same material to prevent warpage of the organic light emitting diode display device caused by differences in coefficient of thermal expansion.

Furthermore, the organic light emitting diode display device according to the present invention further includes a moisture absorbent disposed between the flexible substrate 120 and the bottom film 100a. Particularly, the moisture absorbent is disposed on the upper surface of the bottom film 100a.

Figure 3A:
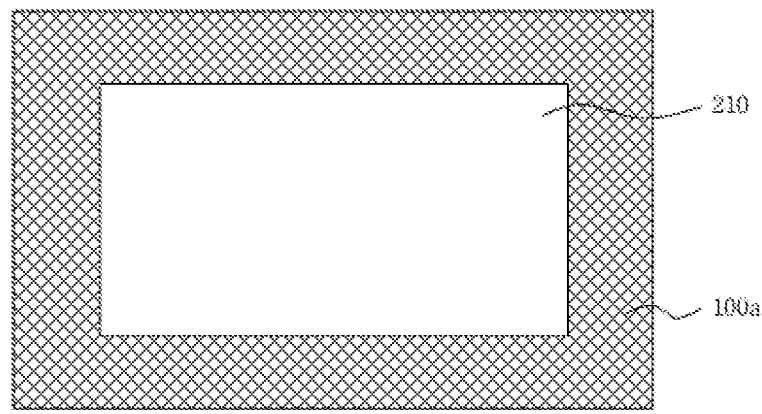
FIGS. 3A to 3C are plan views illustrating a moisture absorbent adhered to a bottom film of FIG. 1.
Figure 3B:
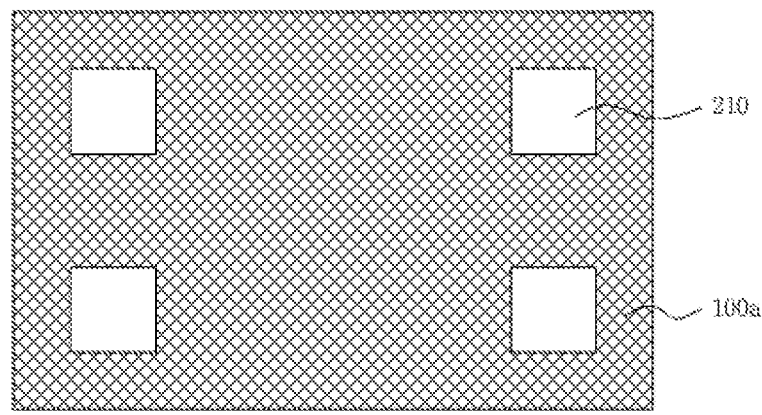
Figure 3C:
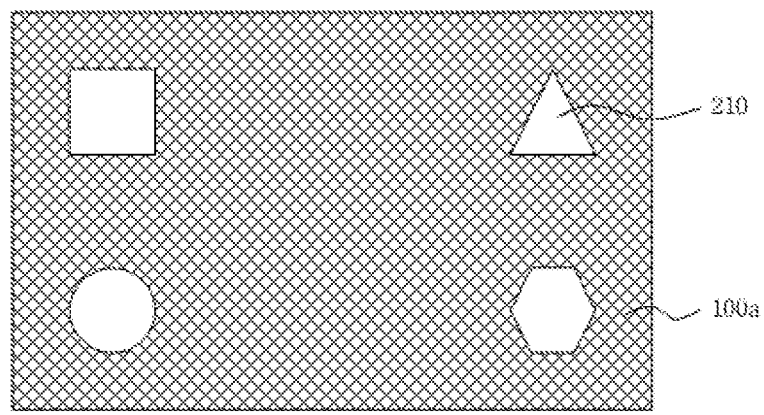

FIGS. 3A to 3C are plan views illustrating a moisture absorbent adhered to the bottom film of FIG. 1.

Referring to FIGS. 3A to 3C, a moisture absorbent 210 is formed on the upper surface of the bottom film 100a to prevent external moisture from being introduced into the organic light emitting diode array 140 of FIG. 1 through the flexible substrate 120 of FIG. 1. The moisture absorbent 210 is formed of barium oxide (BaO) or calcium oxide (CaO).

In this regard, the moisture absorbent 210 may be integrally formed on the upper surface of the bottom film 100a as illustrated in FIG. 3A, or a plurality of moisture absorbents 210 having the same shape may be formed as illustrated in FIG. 3B. Alternatively, a plurality of moisture absorbents 210 having different shapes may be formed as illustrated in FIG. 3C. Meanwhile, although not shown herein, the moisture absorbent may further be formed on the lower surface of the cover film 100b.

Then, referring back to FIG. 1, an anti-reflective coating 200 is formed on the cover film 100b. The anti-reflective coating 200 is formed to prevent visibility deterioration caused by external light. The anti-reflective coating 200 has a thickness of 110 µm to 160 µm and includes a quarter wave plate (QWP) and a polarizing film.

Particularly, external light is incident via a polarizing film formed of poly vinyl alcohol (PVA). In this regard, since the polarizing film transmits external light having the same polarization axis, while absorbing external light not having the same polarization axis, the external light is linearly polarized in the polarization direction. Then, the linearly polarized light is circularly polarized such that the vibration direction of light rotates while passing through the QWP.

In addition, the rotation direction of the circularly polarized light is reversed while being reflected by the organic light emitting diode array 140, and the circularly polarized light is reconverted to linearly polarized light while passing through the QWP again. In this regard, a polarization plane of the re-linearly polarized light after passing through the QWP is perpendicular to a polarization plane of the linearly polarized light before passing through the QWP. Thus, the re-linearly polarized light has a polarization axis perpendicular to that of the polarizing film. Thus, external light is absorbed by the polarizing film, and reflection thereof is prevented.

In addition, although not shown herein, a protective film formed of an acetate resin such as triacetyl cellulose (TAC), a polyester resin, a polycarbonate resin, a polyamide resin, a polyimide resin, a polyolefin resin, and an acrylic resin may be attached to the anti-reflective coating 200.

In the organic light emitting diode display device according to the first embodiment of the present invention as described above, the cover film 100b disposed on the organic light emitting diode array 140 is formed of the same material as the bottom film 100a attached to the lower surface of the flexible substrate 120 on which the organic light emitting diode array 140 is formed. Thus, reliability deterioration caused by warpage of the organic light emitting diode display device due to differences in coefficient of thermal expansion between the cover film 100b and the bottom film 100a may be prevented. Furthermore, reliability against moisture may be improved by forming the moisture absorbent 210 on the bottom film 100a.

*Second Embodiment*

Figure 4:
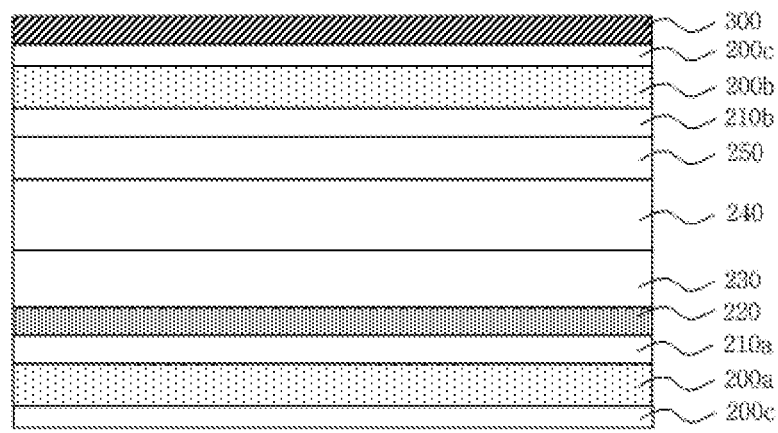
FIG. 4 is a cross-sectional view of an organic light emitting diode display device according to a second embodiment of the present invention.

FIG. 4 is a cross-sectional view of an organic light emitting diode display device according to a second embodiment of the present invention.

Referring to FIG. 4, the organic light emitting diode display device according to the second embodiment of the present invention includes an organic light emitting diode array 240 formed on a flexible substrate 220, a cover film 200b attached to cover the organic light emitting diode array 240, and a bottom film 200a attached to the lower surface of the flexible substrate 220. In addition, a barrier layer 200c is further formed on at least one of the upper and lower surfaces of the cover film 200b and at least one of the upper and lower surfaces of the bottom film 200a.

Particularly, the flexible substrate 220 is a plastic film including at least one organic material selected from the group consisting of polyethylene naphthalate (PEN), polyethylene terephthalate (PET), polyethylene ether phthalate, polycarbonate, poly arylate, polyether imide, polyether sulfonate, polyimide, and polyacrylate.

A buffer layer 230 is disposed between the flexible substrate 220 and the organic light emitting diode array 240. The buffer layer 230 is formed to prevent moisture and oxygen passing through the flexible substrate 220 from diffusing into the organic light emitting diode array 240.

The buffer layer 230 may have a single layer structure or a multilayer structure including an inorganic insulating material such as silicon oxide ($SiO_x$) and silicon nitride ($SiN_x$). In addition, the buffer layer 230 may have a thickness of 2 µm or less.

The organic light emitting diode array 240 is formed on the flexible substrate 220 such that the buffer layer 230 is interposed therebetween. Although not shown in FIG. 4, the organic light emitting diode array 240 includes a thin film transistor and an organic light emitting diode. The thin film transistor includes a gate electrode, a gate insulating layer, a semiconductor layer, a source electrode, and a drain electrode. The organic light emitting diode includes a first electrode, an organic emission layer, and a second electrode.

A protective layer 250 is formed to cover the organic light emitting diode array 240. The protective layer 250 may have a single layer structure or a multilayer structure including an inorganic insulating material. The inorganic insulating material contain silicon (Si) or aluminum (Al), such as aluminum oxide (AlOx), silicon oxynitride (SiON), silicon nitride ($SiN_x$), and silicon oxide ($SiO_x$). The protective layer 150 may also have a multilayer structure in which an organic insulating material and an inorganic insulating material are laminated. In this regard, the organic insulating material may be an epoxy organic insulating material or an organic insulating material containing a thermosetting material having a curing temperature of 100° C. or less. Here, the inorganic insulating material is formed by low-temperature PECVD at 100° C. or less.

The cover film 200b is adhered to the protective layer 250 via an upper adhesive layer 210b, and the bottom film 200a is adhered to the lower surface of the flexible substrate 220 via a lower adhesive layer 210a.

In this regard, the cover film 200b and the bottom film 200a may be respectively formed of an isotropic or anisotropic material such as a cyclic olefin copolymer (COC), cyclic olefin polymer (COP), polycarbonate (PC), polyethylene terephthalate (PET), and polyethylene naphthalate (PEN).

Particularly, when the cover film 200b and the bottom film 200a have isotropic properties, the cover film 200b and the bottom film 200a respectively have a phase retardation of 0 nm to 3 nm. In addition, when the cover film 200b and the bottom film 200a have anisotropic properties, the cover film 200b and the bottom film 200a respectively have a phase retardation of 120 nm to 148 nm. The cover film 200b and the bottom film 200a may respectively have a thickness of 50 μm to 100 μm.

The upper adhesive layer 210b and the lower adhesive layer 210a are formed of a pressure sensitive acrylic adhesive, an olefin pressure sensitive adhesive, a silicone pressure sensitive adhesive. The upper adhesive layer 210b and the lower adhesive layer 210a have a thickness of 50 μm to 75 μm, respectively. Particularly, the upper adhesive layer 210b and the lower adhesive layer 210a respectively have a water vapor permeability of 10 g/m²·day or less and a transmittance of 95% or greater in the visible range. The upper adhesive layer 210b and the lower adhesive layer 210a respectively have an adhesion of 1300 gf/inch or greater on an alkali-free glass substrate. The upper adhesive layer 210b and the lower adhesive layer 210a respectively have a haze of 2% or less, as measured using a haze meter.

The barrier layer 200c is further formed on at least one of the upper and lower surfaces of the cover film 200b and at least one of the upper and lower surfaces of the bottom film 200a. FIG. 4 illustrates that the barrier layers 200c are formed on the upper surface of the cover film 200b and the lower surface of the bottom film 200a.

The barrier layer 200c may have a single layer structure or multilayer structure including an inorganic layer or organic layer alone, or a multilayer structure in which an inorganic layer and an organic layer are laminated. In this regard, the inorganic layer has a thickness of 10 nm to 50 nm, and the organic layer has a thickness of 1 μm to 3 μm.

Particularly, the inorganic layer includes an inorganic material including silicon (Si) or aluminum (Al), such as aluminum oxide ($Al_xO_y$), silicon oxynitride ($SiON_x$), silicon oxide ($SiO_x$), and silicon nitride ($SiN_x$). The organic layer includes an epoxy organic material, an acrylic organic material, or the like.

The barrier layer 200c may have a water vapor permeability of $5\times10^{-1}$ g/m²·day to $5\times10^{-3}$ g/m²·day and a transmittance of 89% or greater in the visible range.

Since the barrier layer 200c is further formed on at least one of the upper and lower surfaces of the cover film 200b and at least one of the upper and lower surfaces of the bottom film 200a in the organic light emitting diode display device according to the second embodiment of the present invention, inflow of external moisture and oxygen may be efficiently prevented. Thus, the thickness of the buffer layer 230 disposed between the flexible substrate 220 and the organic light emitting diode array 240 may be reduced or the buffer layer 230 may be removed.

In addition, a moisture absorbent formed of barium oxide (BaO) or calcium oxide (CaO) may further be formed on the upper surface of the bottom film 200a. The moisture absorbent may be integrally formed on the upper surface of the bottom film 200a, or a plurality of moisture absorbents having the same shape may be formed. Alternatively, a plurality of moisture absorbents having different shapes may be formed. The moisture absorbent may further be formed on the lower surface of the cover film 200b.

An anti-reflective coating 300 is formed on the cover film 200b. In FIG. 4, the anti-reflective coating 300 is formed on the barrier layer 200c, since the barrier layer 200c is formed on the cover film 200b.

The anti-reflective coating 300 is formed to prevent visibility deterioration by external light. The anti-reflective coating 300 has a thickness of 110 μm to 160 μm and includes a quarter wave plate (QWP) and a polarizing film.

In the organic light emitting diode display device according to the second embodiment of the present invention, the barrier layer 200c is formed on at least one of the upper and lower surfaces of the cover film 200b and at least one of the upper and lower surfaces of the bottom film 200a as described above. Thus, inflow of external oxygen into the organic light emitting diode array 240 may be efficiently prevented.

The organic light emitting diode display device as described above may have the following effects.

First, since the cover film adhered to the upper surface of the organic light emitting diode array is formed of the same material as the bottom film adhered to the lower surface of the flexible substrate on which the organic light emitting diode array is formed. Thus, reliability deterioration caused by warpage of the organic light emitting diode display device due to differences in coefficient of thermal expansion between the cover film and the bottom film may be prevented.

Second, since a moisture absorbent is formed on the upper surface of the bottom film, reliability against moisture may be improved.

Third, since the barrier layer is further formed on at least one of the upper and lower surfaces of the cover film and at least one of the upper and lower surfaces of the bottom film, inflow of external oxygen may be efficiently prevented.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting diode display device comprising:
   an organic light emitting diode array formed on a flexible substrate;
   a cover film formed to cover the organic light emitting diode array;
   a bottom film attached to a lower surface of the flexible substrate, the cover film and the bottom film being formed of the same material, wherein the bottom film and the cover film have the same coefficient of thermal expansion; and
   a plurality of moisture absorbents formed between the bottom film and the flexible substrate and disposed on an upper surface of the bottom film, the plurality of moisture absorbents having different shapes and being in direct contact with an upper surface of the bottom film,
   wherein the bottom film is attached to the lower surface of the flexible substrate via an adhesive layer in portions where the plurality of moisture absorbents are not provided, and the bottom film is attached to the lower surface of the flexible substrate via the adhesive layer and the plurality of moisture absorbents in portions where the plurality of moisture absorbents are provided, wherein the organic light emitting diode array is configured to emit light in a path toward the cover film and the plurality of moisture absorbents are disposed between the flexible substrate and the bottom film and outside of the path of light emitted from the organic light emitting diode array, and wherein the plurality of moisture absorbents are disposed in regions corresponding to each corner of the bottom film and at least two moisture absorbents disposed at opposite corners of the bottom film have different shapes from each other while a center region of the bottom film remains free of the plurality of moisture absorbents.

2. The organic light emitting diode display device according to claim 1, wherein the cover film is adhered to the organic light emitting diode array and the bottom film is adhered to the flexible substrate respectively via an adhesive layer formed of a material selected from the group consisting of an acrylic pressure sensitive adhesive, an olefin pressure sensitive adhesive, and a silicone pressure sensitive adhesive.

3. The organic light emitting diode display device according to claim 1, further comprising a barrier layer formed on at least one of the upper and lower surfaces of the cover film and at least one of the upper and lower surfaces of the bottom film.

4. The organic light emitting diode display device according to claim 3, wherein the barrier layer has a single layer structure or a multilayer structure comprising an inorganic layer or organic layer alone or a multilayer structure in which an inorganic layer and an organic layer are laminated.

5. The organic light emitting diode display device according to claim 4, wherein the inorganic layer comprises a material comprising silicon (Si) or aluminum (Al) selected from the group consisting of aluminum oxide ($Al_xO_y$), silicon oxynitride ($SiON_x$), silicon oxide ($SiO_x$), and silicon nitride ($SiN_x$).

6. The organic light emitting diode display device according to claim 4, wherein the organic layer comprises an epoxy organic material or an acrylic organic material.

7. The organic light emitting diode display device according to claim 1, wherein the cover film and the bottom film are formed of the same material, and the flexible substrate is formed of a different material from the cover film and the bottom film.

8. The organic light emitting diode display device according to claim 1, wherein the flexible substrate includes at least one of polyethylene naphthalate (PEN), polyethyleneterephthalate (PET), polyethylene etherphthalate, poly carbonate, poly arylate, polyether imide, polyether sulfonate, polyimide, and polyacrylate, and the cover film and the bottom film include at least one of a cyclic olefin copolymer (COC), cyclic olefin polymer (COP), polycarbonate (PC), polyethylene terephthalate (PET), and polyethylene naphthalate (PEN).

9. The organic light emitting diode display device according to claim 1, wherein the cover film and the bottom film are both formed of cyclic olefin copolymer (COC) or cyclic polymer (COP).

* * * * *